United States Patent [19]

Davis et al.

[11] Patent Number: 5,092,943
[45] Date of Patent: Mar. 3, 1992

[54] METHOD OF CLEANING PRINTED CIRCUIT BOARDS USING WATER

[75] Inventors: James L. Davis, Tamarac; Robert W. Pennisi, Boca Raton; Fadia Nounou, Plantation; Bobby D. Landreth, Ft. Lauderdale; Robert J. Mulligan, Plantation, all of Fla.

[73] Assignee: Motorola, Inc., Schaumburg, Ill.

[21] Appl. No.: 583,629

[22] Filed: Sep. 17, 1990

[51] Int. Cl.$^5$ .............................................. B23K 35/34
[52] U.S. Cl. ...................................... 148/23; 148/24; 148/25
[58] Field of Search ...................... 148/23-25

[56] References Cited

U.S. PATENT DOCUMENTS

| | | | |
|---|---|---|---|
| 2,898,255 | 8/1959 | Thompson | 148/23 |
| 3,436,278 | 4/1969 | Poliak | 148/23 |
| 3,734,791 | 5/1973 | Poliak | 148/23 |
| 3,796,610 | 3/1974 | Sarnacki et al. | 148/25 |
| 4,460,414 | 7/1984 | Hwang | 148/23 |
| 4,541,876 | 9/1985 | Hwang | 148/23 |

OTHER PUBLICATIONS

Absbract to J. Brous, "Effects of Water Soluble Flux Materials on Circuit Board Insulation Resistances", *Proceedings of the Technical Program of the National Electronic Packaging and Production Conference*, vol. 1, pp. 125-39, 1981.

*Primary Examiner*—Peter D. Rosenberg
*Attorney, Agent, or Firm*—Daniel K. Nichols

[57] ABSTRACT

Solder pastes having vehicles including blends of low boiling point alcohols and relatively high boiling point alcohols are described which leave residues which may be cleaned using only water are described. The low boiling point alcohols have a boiling point range of between about 65° and about 150° C. whereas the high boiling point alcohols have a boiling point in rhe range of about 150° to about 270° C. The solder pastes also use water-soluble organic acids as fluxing agents such as compounds of the formula:

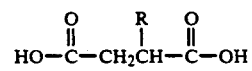

where R is an electron withdrawing group such as fluorine, chlorine, bromine, iodine, sulfur, hydroxyl, nitrile, and benzyl. Other suitable formic-acid fluxing agents include, but are not limited to, adipic acid, polyacrylic acid, methacrylic acid and polymethacrylic acid. The compounds clean oxides from the printed circuit boards (PCBs) under assembly and then volatilze leaving a residue to be cleaned away. The cleaning step involves rinsing with water. No undesired residue remains indicating that the organic acids of the invention are effective in cleaning boards. Malic acid is a preferred organic acid fluxing agent.

17 Claims, No Drawings

METHOD OF CLEANING PRINTED CIRCUIT BOARDS USING WATER

CROSS-REFERENCES TO RELATED APPLICATIONS

This application is related to U.S. patent application Ser. No. 07/524,540, filed on May 17, 1990 which relates to solder flux formulations containing malic acid; U.S. patent application Ser. No. 583,129, filed on Sept. 17, 1990 which relates to solder pastes incorporating acrylic acid therein to improve fluxing action; and U.S. patent application Ser. No. 07/521,871 filed May 11, 1990 relating to solder paste vehicles using blends of monofunctional and polyfunctional alcohols.

FIELD OF THE INVENTION

The invention relates to solder paste formulations, and in one aspect, more particularly relates to solder paste formulations that produce a residue that is cleanable with water.

BACKGROUND OF THE INVENTION

Solder formulations, also known as solder creams or solder pastes, are homogeneous blends of a soft solder alloy typically in a powder form dispersed in a liquid medium conventionally containing a fluxing composition or flux, an organic solvent, and a thickening agent which will give the desired viscous or paste-like consistency to the solder formulation. Such solder formulations can be applied to the surfaces of locations in a number of various ways, such as by screen printing, or by means of a dispenser such as a syringe, or simply by dipping the site to be soldered into the solder paste formulation so that the viscous paste adheres to the site, such as an electronic component lead.

Recently, solder paste formulations have been used increasingly by the electronics industry, particularly in the automated manufacture of printed circuits in which leadless miniature electronic components are surface mounted on a printed circuit board (PCB) to which a solder paste formulation has previously been applied, such as by screen printing. The PCB is then subjected to a sufficiently high temperature, for example by means of a heated conveyor belt, to cause the flux and solder alloy in the formulation to liquefy and contact the electronic component leads so that on subsequent cooling of the PCB, the components will remain soldered on the PCB.

The rheological properties of the solder paste dictate the screen printability of the material. Hence, in order to obtain good line definition on the PCB, the rheology of the paste must fall within a relatively narrow process window. Solder paste rheology is largely determined by those components of the solder paste which are collectively known as the vehicle. Generally, solder paste vehicles consist of solvents to dissolve the rosin fluxes or fluxing agents and the activators, and other additives to achieve the proper rheology. Currently, cyclohexanol (sorbitol) derivatives and various Cellosolve TM mono- and dialkyl ethers of ethylene glycol and derivatives thereof are used in commercial solder pastes. Problems encountered with conventional solvents include poor solubility of the organic acid fluxing agents in the solvents—which is sometimes addressed by using more solvent than is considered desirable, and an inability to obtain high viscosities (poor rheological control). Many of these components do not volatilize under reflow conditions and therefore result in a residue which needs to be removed by chlorofluorocarbon (CFC), terpene, aqueous, exotic gas or other cleaning techniques. Some of these materials are hazardous or toxic and CFCs have been linked to the underside degradation of atmospheric ozone. Thus, it would be an improvement in the art to eliminate residues and the materials used to remove them.

For some uses in the electronics industry, it is desirable to use as the flux composition of the solder formulation a material which is non-corrosive and which will provide, after the heating and cooling steps, flux residues which are themselves non-corrosive and non-conducting. For this reason, rosin-based flux compositions are widely used in the commercially available solder paste formulations specifically made for use in the manufacture of surface mounted electronic components.

Alternatively, more reactive fluxing compositions may be used, which leave residues which are corrosive and/or conductive. Often a somewhat corrosive fluxing composition is desired so that the oxides which form on the metal surfaces to be soldered may be removed to permit the subsequently formed solder bond to be stronger both physically and electrically. However, it is necessary to remove these residues formed by means of either aqueous or organic solvent systems to ensure that the resulting solder circuit is non-corrosive.

The use of solder paste formulations containing such rosin-based or more reactive fluxes has a number of disadvantages. First, because the non-corrosive residues (such as rosins) tend to be sticky, they prevent repetitive automatic testing of the circuit. Rosin-based fluxes tend to leave copious amounts of residue on the circuit. Additionally, such residues are unsightly and therefor, as with the corrosive flux residues which are also unattractive, will need to be removed. The removal step involves extra production equipment, time and material.

Secondly, flux residues tend to be hygroscopic and may thereby cause spattering. Thirdly, some fluxes permit solder particles in the paste to move away from the solder site and give rise to the formation of numbers of discrete small balls of soft solder around the soldered joints, which can create electrical short circuits.

Because of these and other disadvantages, it is desirable and often essential to meet specifications, to remove the flux residues and any solder balls as much as possible. Often, however, their removal is difficult or impossible, particularly from areas of the PCB underneath the electronic components.

As noted, a common procedure is to use an aqueous or organic solvent in the removal of flux residues. Water is preferred because it will not leave an objectionable residue itself. Organic solvents are more effective, but less desirable because they are more expensive and particularly because they are more troublesome to dispose of. A particular class of organic solvents that had attained widespread use was the halocarbons, such as the chlorofluorocarbons (CFCs), because they would volatilize after cleaning. However, these materials are particularly inert and their eventual decomposition is involved in the undesirable depletion of atmospheric ozone. Thus, the solder paste formulations of the present invention do not contain and do not require CFCs for residue removal.

Thus, for these and other reasons the prior solder fluxing compositions are less preferred, and it would therefore be advantageous to discover a new fluxing composition that would avoid one or more of these disadvantages. For example, it would be advantageous to provide a solder pastes whose residues could be easily cleanable by water.

SUMMARY OF THE INVENTION

Accordingly, it is an object of the present invention to provide a solder paste fluxing composition that would provide an oxide removing agent during the soldering process.

It is another object of the present invention to provide a novel solder paste which is an oxide removing agent that would either readily volatilize or be readily removed with water.

It is yet another object of the invention to provide a solder paste composition that would accomplish the above objectives, but also be easy to formulate.

In carrying out these and other objects of the invention, there is provided, in one form, a method of mounting electronic components on a printed circuit board providing a residue cleanable with water which involves first formulating a solder paste by mixing together a solder paste vehicle having a solvent blend selected from the group consisting of a blend of low boiling point alcohols having a boiling point in the range of about 65° and about 150° C. and high boiling point alcohols having a boiling point in the range of about 150° and about 270° C.; a fluxing agent; and a solder powder comprising a metal selected from the group consisting of lead, tin, antimony, silver and mixtures thereof. Next, the solder paste is applied to a metallic surface to be soldered. At least one electronic component is placed on the metallic surface to be soldered. Then the solder paste is caused to reflow and form a solder bond producing a residue on the metallic surface. Finally, the residue is removed by washing the surface with water.

DETAILED DESCRIPTION OF THE INVENTION

It has been discovered that water is an inexpensive, readily available and readily disposable solvent for washing away the residues left from a solder reflow operation, such as the assembling of electronic components to a printed circuit board (PCB) using particular solder paste formulations. Typically, an organic acid is used in the solder paste to serve as an effective fluxing agent by removing the oxides from the metallic surfaces to which the component is to be bonded. The organic acid should be soluble in water so that water may wash away the residue after the bonding step.

Suitable organic acid materials that are soluble in water include compounds of the formula:

where R is an electron withdrawing group, which added as the sole or joint fluxing agent to solder pastes is an effective flux for the soldering of solders such as tin/lead, tin/lead/silver and tin/lead/silver/antimony to metals such as copper, aluminum, etc. In one aspect, the R group may be fluorine, chlorine, bromine, iodine, sulfur, nitrile, hydroxyl, benzyl or some other electron withdrawing group. Phrased another way, R must be electronegative, although there is no specific degree of electronegativity required.

Other suitable organic fluxing agents include, but are not limited to, adipic acid, acrylic acid, polyacrylic acid, methacrylic acid and polymethacrylic acid. These excellent fluxing compositions produce substantially less residue than conventional fluxing agents based on rosin chemistry, and in some cases produce no residue at all. Where residue is present, however, it may be easily and quickly removed with formic acid.

In one aspect of the invention where R is hydroxyl, the formula above represents malic acid, HOOCCH$_2$CH(OH)COOH. As will be explained, malic acid was unexpectedly found to perform surprisingly better than some of the other organic acids screened. It has also been discovered that there are a number of ways to implement this concept.

More specifically, these formic acid-soluble organic acids have been found to serve as good fluxing agents for soldering Sn/Pb and Sn/Pb/Ag compositions to copper over and above some of the other organic acids. It will be appreciated, however, that other solders are expected to be useful in conjunction with malic acid, and that other metals besides copper are expected to be effectively cleaned and bonded to by formulations containing malic acid. The flux can be prepared in a variety of ways, including, but not limited to:

(1) The addition of organic acid powder to a solder paste vehicle.

(2) A solution of the water-soluble acid in a number of solvents, including, but not limited to alcohols such as isopropanol and Cellosolve TM derivatives.

With these solder formulations, tests have shown that these organic acids are effective fluxing agents, resulting in solder reflow bonds having minimum residue, which can be easily removed by water. The addition of the organic acids acid to the paste vehicle is straightforward since the material is a solid powder at room temperature.

The fluxing action of these organic acids appears to be derived from the ability of the acid to reduce surface oxides. Interestingly, malic acid can also be used directly as a flux for solder balls or spheres.

The solder used in this process should be untreated solder powder. The metals of the solder may include, but are not limited to lead, tin, antimony, silver and mixtures thereof. These types of solder metals were found to exhibit excellent reflow characteristics.

In the instances where malic acid is used in conjunction with a solvent to provide a vehicle for a solder formulation, in one aspect the proportion of malic acid in the vehicle ranges from about 0.1 to about 60 wt. % of the vehicle, and in a preferred aspect from about 0.3 to about 40 wt. % of the vehicle.

It will be appreciated that the proportion of organic acid as a proportion of the solder paste vehicle will vary depending on the particular formulation. For example, high temperature solder pastes or pastes for highly oxidized metal surfaces may require a different organic acid proportion to those outlined above. The balance of the fluxing composition may be any of the customary materials. It will be appreciated that although the other common materials, such as the rosins, may be used in conjunction with the compounds of the invention, that some of these typical materials contribute to flux residues and should not be employed to take full advantage of the water-soluble characteristics provided by the flux compositions of the present invention.

Current solder pastes are based on rosin fluxing agents which degrade during reflow to give dark brown, crusty residues that are commonly removed with chlorofluorocarbon solvents. By way of contrast, all residues from the solder pastes of this invention are completely water soluble, eliminating the use of CFCs in printed circuit board cleaning operations.

Suitable alcoholic solvents for dissolving the fluxing agents in these pastes are a blend of at least two types of alcohols: low boiling point alcohols and relatively high boiling point alcohols. The low boiling point alcohols boil within a range of about 65° to about 150° C., preferably from about 70° to about 130° C. In turn, the high boiling point alcohols boil within a range of about 150° to about 270° C., preferably from about 150° to about 220° C. Generally, the low boiling point alcohols have a molecular weight range from about 46 to about 130, preferably from about 88 to about 130. The relatively higher boiling point alcohols have a molecular weight range from about 60 to about 180, preferably from about 100 to about 180.

Representative low boiling point alcohols include, but are not limited to ethanol; 2-methyl-1-propanol; neopentyl alcohol; 2,2-dimethyl-3-pentanol; isopropanol; 1-pentanol; 2-pentanol; and mixtures thereof and the like. Representative high boiling point alcohols include, but are not limited to 2-butoxy-ethanol; 2-(2-ethoxyethoxy)ethanol; octanols; pentanediols; dodecanol; 3-phenyl-1-propanols; benzyl alcohol; 2,3-dimethyl-2,3-butanediols; dimethycyclohexanols; ethylene glycol; naphthaleneethanol; and mixtures thereof and the like.

The solder pastes of this invention may optionally contain paraformaldehyde as a blowing agent and formic acid generator. In one embodiment of the present invention, the solder paste has the following formulation:

about 4 to about 10 wt. % solvent blend; which may include: 2-5% low boiling point alcohol; and 2-5% high boiling point alcohol;
about 1 to about 5wt. % organic acid fluxing agent (e.g. malic acid and/or adipic acid and/or polyacrylic acid);
about 85 to about 94 wt. % solder powder; and
0 to about 5 wt. % paraformaldehyde.

Other specific formulations would also be expected to be useful. Further, in a finalized formulation, various thixotropes, in a proportion of about 1-2%, will likely be added in order to achieve proper rheology for optimum screen printing. In one embodiment, if both malic acid and polyacrylic acid are used, a preferred proportion of malic acid is about 1%, and that of polyacrylic acid from about 0.5 to 1%.

The proposed solder pastes containing a water-soluble organic acid fluxing agent can replace current solder fluxing systems based on rosin additives. For example, malic acid can replace the acid in conventional abietic acid-based fluxes. The addition of malic acid to the solder pastes will achieve excellent solder reflow properties and eliminate the residue problems that plague conventional solder pastes. This lack of residue reduces the need for any board cleaning with ozone-depleting CFCs after solder reflow.

Solder pastes with the compositions given above were formulated and tested. The pastes exhibited good screen printability and excellent reflow characteristics for pastes containing 2 to 5% organic acids. Lower concentrations of acids did result in reflow; however, insufficient wetting of copper surfaces due to inadequate oxide removal occurred. The introduction of a low molecular weight alcohol is required to speed the dissolution of the acid and the paraformaldehyde. The higher boiling point alcohol is required in order to give the paste proper rheological properties both at room temperature and at soldering temperatures. Reflowing the solder in an open atmosphere resulted in the formation of a small amount of clear to white residue on the top of the solder joint. The residue could be easily removed by rinsing with water. The length of the water rinse varied with the paste formulation. The shortest rinsing times (10 seconds) were observed for the malic and polyacrylic acid based pastes, while pastes employing adipic acid were found to require several minutes of rinsing. The formulation of a water cleanable solder paste is significant because it will eliminate the use of CFCs in printed circuit board cleaning. Boards can be cleaned either by rinsing briefly in water or soldering in a nitrogen/water atmosphere.

With any of these organic acid fluxes and methods of this invention, no retooling would be required in the existing assembly line. If some residue does remain with certain of these systems, it will further be appreciated that it may be washed away with water. Depending on the exact organic fragments from the non-metallic compounds, the water to rinse them will probably need to be treated as well. Nevertheless, these concerns are appreciably less than those presented by the CFC cleaning agents or other organic cleaning agents.

The invention will be described in more detail with respect to the following illustrative examples.

EXAMPLES 1-15

Various organic acids were added, in quantities ranging from about 10 to about 100 mg., to an aluminum pan containing 10 to 15 30 mil diameter solder spheres. A couple of drops of isopropyl alcohol (IPA) were also added to the pans. The pans were heated on a hot plate to temperatures above the melting point of the tin/lead solder spheres. Whether or not the solder balls coalesced was observed. Coalescence is a measure of whether reflowing of the solder and wetting of the pan occurred. The following organic acids were evaluated.

TABLE I

Organic Acid Screening

| Example | Acid | Solder ball coalescence occurred? |
|---|---|---|
| 1 | Abietic acid | Yes |
| 2 | Adipic acid | Yes |
| 3 | Ascorbic acid | Yes |
| 4 | Acrylic acid | Yes |
| 5 | Citric acid | Yes |
| 6 | 2-Furoic acid | Yes |
| 7 | Malic acid | Yes |
| 8 | Polyacrylic acid | Yes |
| 9 | Acetic acid | No |
| 10 | Cyclohexane carboxylic acid | No |
| 11 | Formic acid | No |
| 12 | Hexanoic acid | No |
| 13 | 4-Hydroxybutyric acid/Na salt | No |
| 14 | Maleic acid | No |
| 15 | Oxalic acid | No |

EXAMPLE 16

Water Soluble Residue Solder Paste Formulation

A solder paste was formulated with the following composition:

0.85544 g—Solder powder: 63% Sn/36.65% Pb/0.35% Sb
0.06190 g—Paraformaldehyde (Aldrich Chemical Co., 95%)
0.04659 g—Malic Acid (Aldrich, 99%)
0.15591 g—Isopropanol (IPA, Fischer Chemical Co. >99.9%)
0.00965 g—2-Butoxy ethanol (Aldrich, >99%)

The solder paste was placed in copper plated pans and reflowed. Temperatures were measured by a surface thermometer and thus may have read lower than the actual temperature of the pan.

The solder paste reflowed and the pan was removed from the heat source when the temperature was 220°-250° C. A white-bubbly residue was visible under a microscope at 30X. The residue was removed by physically scraping it from the surface or by dissolving the residue by placing the pan in an ultrasonic water bath for 1 to 3 minutes.

EXAMPLES 17-20

Additional Solder Paste Formulations

The following solder pastes were formulated as noted.

EXAMPLE 17

| Amount, g. | Wt. % | Component |
|---|---|---|
| 0.87712 | 80.0 | Solder powder |
| 0.01632 | 1.5 | Paraformaldehyde |
| 0.06401 | 5.8 | Malic acid |
| 0.05875 | 5.4 | IPA(isopropyl alcohol) |
| 0.08157 | 7.4 | 2-(2-Ethoxyethoxy)ethanol (Aldrich, >99%) |

This formulation produced good reflow.

EXAMPLE 18

| Amount. g. | Wt. % | Component |
|---|---|---|
| 2.7908 | 90.7 | Solder powder (Sn/Pb/Sb) |
| 0.0307 | 1.0 | Paraformaldehyde |
| 0.0026 | 0.08 | Malic acid |
| 0.1197 | 3.9 | 2-(2-Ethoxyethoxy)ethanol |
| 0.1315 | 4.3 | IPA |

This formulation did not produce good reflow results.

EXAMPLE 19

To 0.9385 g. of the formula of Example 18, the following were added:

| Amount. g. | Component |
|---|---|
| 0.0479 | IPA |
| 0.0822 | Paraformaldehyde |
| 0.0797 | 2-(Ethoxyethoxy)ethanol |

This formulation did not produce good reflow results.

EXAMPLE 20

To 1.4771 g. of the formulation of Example 18, the following were added:

| Amount. g. | Component |
|---|---|
| 0.0949 | 2-(Ethoxyethoxy)ethanol |
| 0.0558 | IPA |
| 0.0079 | Malic acid |

The formulation of Example 20 cause some reflow, but copper/solder wetting was not adequate. A white residue remained after reflow that was removed by 10 seconds in an ultrasonic water bath, leaving behind a shiny solder surface.

EXAMPLE 21

Water Soluble Residue Solder Paste Formulation

A solder paste was formulated with the following composition:
89.8% 2.0192 g—Solder powder: 63% Sn/36.65% Pb/0.35% Sb
0.4% 0.0091 g—Malic Acid (Aldrich Chemical Co., 99%)
0.3% 0.0074 g—Adipic Acid (Aldrich, >99%)
1.4% 0.0319 g—Paraformaldehyde (Aldrich, 95%)
4.0% 0.0902 g—Isopropanol (IPA, Fischer Chemical Co. >99.9%)
4.0% 0.0900 g—2-(2-Ethoxyethoxy) ethanol The solder paste was placed in copper plated pan and heated until reflow occurred (190°-250° C.). A light brown residue formed after reflow which was not as soluble in water as the case of malic acid alone. Addition of one drop of concentrated formic acid (88%, Fisher Scientific) to the paste mixture in the pan prior to reflow did not result in the degree of wetting that was observed for the initial paste. However, a second drop of formic acid was added to the paste at 250° C. This resulted in removal of all visible residue.

EXAMPLE 22

Polyacrylic Acid Solder Paste Formulation

A solution of polyacrylic acid (average molecular weight of about 2000% and isopropanol was added to a copper plated can containing about ten commercially available solder balls. Solder ball reflow resulted in a small amount of residue that disappeared after 10 seconds in a hydrosonic water bath. During the first run, the pan was accidentally dropped while the residue was still a liquid. The residue ran off the pan leaving no visible residue.

EXAMPLE 23

Malic Acid Solder Paste

A very low residue, water cleanable solder paste was formulated with the following composition.
90.0% Solder powder
1.0% Malic acid (Aldrich)
7.0% Solution of 17% Polyacrylic acid in 2-(2-ethoxyethoxy)ethanol
0.3% Ethylenediamine tetraacetic acid
2.0% 2,5-Hexanediol (Aldrich 99%)

This paste was tested in a manner similar to that of Example 16. The reflow characteristics were good and resulted in very minimal residues. All residues that were present were removed by 1 minute rinses with water. Screen printability was also excellent.

EXAMPLE 24

Screen Printability of Malic Acid Solder Paste

The following formulation was prepared:
- 40.4671 g—Solder Powder
- 0.8582 g—Malic Acid
- 1.6176 g—Polyacrylic acid (PAA)/2-(2-ethoxyethoxy)ethanol solution, (18% PPA)

- 1.1520 g—Saturated malic acid/2-(2-butoxyethoxy)ethanol solution (primarily solvent)

- 1.0176 g—2,5-Hexanediol

Additional solder powder (about 5 g) was added to achieve proper viscosity for screen printing. This result may be achieved by adding less hexanediol, on the order of about 1–1.5%. Although the print definition after screening of this material was poor, appearance after reflow was good. A small amount of white residue was observed after reflow. Rinsing for 30 seconds in water was found to remove the residue.

EXAMPLE 25

Screen Printability of Malic Acid Solder Paste

A solder paste formulation of the following materials was made:
- 48.5623 g—Sn/Pb Solder Powder
- 0.9195 g—Malic acid
- 1.7152 g—18% PAA in 2-(2-ethoxyethoxy) ethanol
- 1.1905 g—Saturated malic acid in 2-(2-butoxyethoxy) ethanol
- 0.4214 g—2,5-Hexanediol The screen printability of the paste was excellent. The screen printing was performed both by hand and using the automatic screen printer. Reflow characteristics were excellent. A small amount of white-to-clear residue remained after reflow, which was readily removed by water rinses.

It is apparent that the use of the compounds of this invention provide useful fluxing agents in solder paste vehicles. Malic acid is an especially useful organic acid fluxing agents that performs surprisingly better than other acids, particularly in leaving low portions of residue. Additional embodiments of the invention include, but are not limited to soldering and assembling in a water/nitrogen atmosphere. The discovery of a solder paste with water-soluble residues is significant because it will eliminate the use of CFCs in printed circuit board cleaning.

It will be appreciated that many modifications may be made in the exact implementation of the invention illustrated in the above examples which would still fall within the spirit and scope of the invention as claimed herein. For example, it is anticipated that the processing conditions, modes or sequences of addition of the vehicles and fluxing compositions, and exact combinations of flux components may be altered to optimize the invention by one skilled in the art. It is also expected that the method of this invention could be used to facilitate assembly of PCBs by having solder paste containing the water-soluble organic acid fluxing agents screened thereon.

We claim:

1. A method of mounting electronic components on a printed circuit board providing a flux residue cleanable with water, comprising the steps of:
    formulating a solder paste by mixing together:
    a solder paste vehicle comprising:
        a fluxing agent comprising an organic acid having the formula:

where R is an electron withdrawing group selected from the group consisting of fluorine, chlorine, bromine, iodine, sulfur, hydroxyl, nitrile, and benzyl; and
        a solvent blend selected from the group consisting of a blend of low boiling point alcohols having a boiling point in the range of about 65° to about 150° C. and high boiling point alcohols having a boiling point in the range of about 150° to about 270° C.; and
    a solder powder comprising a metal selected from the group consisting of lead, tin, antimony, silver and mixtures thereof;
    applying the solder paste to a metallic surface to be soldered;
    placing at least one electronic component on the metallic surface to be soldered;
    causing the solder paste to flow and form a solder bond; and
    removing the flux residue by washing the surface with water.

2. The method of claim 1 where the compound in the fluxing agent is malic acid.

3. The method of claim 1 where the solder paste comprises the following formulation:
    about 4 to about 10 wt. % solvent blend;
    about 2 to about 5 wt. % organic acid fluxing agent; and
    about 85 to about 94 wt. % solder powder.

4. The method of claim 3 where there is also present up to about 5 wt. % paraformaldehyde.

5. The method of claim 1 where both malic acid and polyacrylic acid are employed as organic acid fluxing agents.

6. A method of mounting electronic components on a printed circuit board providing a flux residue cleanable with water, comprising the steps of:
    formulating a solder paste by mixing together:
    a solder paste vehicle comprising:
        a solvent blend selected from the group consisting of a blend of low boiling point alcohols having a boiling point in the range of about 65° to about 150° C. and high boiling point alcohols having a boiling point in the range of about 150° C. to about 270° C.; and
        a fluxing agent comprising an organic acid having the formula:

where R is an electron withdrawing group selected from the group consisting of fluorine, chlorine, bromine, iodine, sulfur, hydroxyl, nitrile, and benzyl, and where the proportion of the organic acid in the vehicle ranges from about 0.1 to about 60 wt. % of the vehicle; and a solder powder comprising a metal selected from the group consisting of lead, tin, antimony, silver and mixtures thereof;

applying the solder paste to a metallic surface to be soldered;

placing at least one electronic component on the metallic surface to be soldered;

causing the solder paste to flow and form a solder bond; and removing the flux residue by washing the surface with water.

7. The method of claim 6 where the compound in the fluxing agent is malic acid.

8. The method of claim 6 wherein the solder paste comprises the following formulation:
about 4 to about 10 wt. % solvent blend;
about 2 to about 5 wt. % organic acid fluxing agent; and
about 85 to about 94 wt. % solder powder.

9. The method of claim 8 where there is also present up to about 5 wt. % paraformaldehyde.

10. The method of claim 6 where both malic acid and polyacrylic acid are employed as organic acid fluxing agents.

11. A method of mounting electronic components on a printed circuit board providing a flux residue cleanable with water, comprising the steps of:
formulating a solder paste by mixing together;
a solder paste vehicle comprising:
a solvent blend selected from the group consisting of a blend of low boiling point alcohols having a boiling point in the range of about 65° to about 150° C. and high boiling point alcohols having a boiling point in the range of about 150° to about 270° C.; and
a fluxing agent selected from the group consisting of an organic acid having the formula:

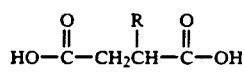

where R is an electron withdrawing group selected from the group consisting of fluorine, chlorine, bromine, iodine, sulfur, hydroxyl, nitrile, and benzyl, and where the proportion of the organic acid in the vehicle ranges from about 0.1 to about 60 wt. % of the vehicle; and a solder powder comprising a metal selected from the group consisting of lead, tin, antimony, silver and mixtures thereof;

where the solder paste comprises the following formulation:
about 4 to about 10 wt. % solvent;
about 2 to about 5 wt. % organic acid fluxing agent;
about 85 to about 94 wt. % solder powder;
about 0 to about 3 wt. % paraformaldehyde;

applying the solder paste to a metallic surface to be soldered;

placing at least one electronic component on the metallic surface to be soldered;

causing the solder paste to flow and form a solder bond producing a residue on the metallic surface; and removing the flux residue by washing the surface with water.

12. The method of claim 11 where the compound in the fluxing agent is malic acid.

13. The method of claim 12 where the fluxing agent additionally comprises polyacrylic acid.

14. The method of claim 11 where the solder paste contains no halocarbons.

15. The method of claim 11 where the low boiling point alcohols have a molecular weight range from about 46 to about 130 and the high boiling point alcohols have a molecular weight range from about 60 to about 180.

16. The method of claim 1 where the fluxing agent is selected from the group consisting of adipic acid, acrylic acid, polyacrylic acid, methacrylic acid, polymethacrylic acid and mixtures thereof.

17. The method of claim 6 where the fluxing agent is selected from the group consisting of adipic acid, acrylic acid, polyacrylic acid, methacrylic acid, polymethacrylic acid and mixtures thereof.

18. The method claim 11 where the fluxing agent is selected from the group consisting of adipic acid, acrylic acid, polyacrylic acid, methacrylic acid, polymethacrylic acid and mixtures thereof.

* * * * *